United States Patent
Huybers et al.

(10) Patent No.: US 10,763,136 B2
(45) Date of Patent: Sep. 1, 2020

(54) APPARATUS AND SYSTEM

(71) Applicant: NEXPERIA B.V., Nijmegen (NL)

(72) Inventors: Ralph Huybers, Nijmegen (NL); Hans Van De Rijdt, Nijmegen (NL)

(73) Assignee: Nexperia B.V., Nijmegen ( * ) Notice: Subject to any disclaimer, the term of this patent is extended or adjusted under 35 U.S.C. 154(b) by 0 days.

(21) Appl. No.: 16/222,368

(22) Filed: Dec. 17, 2018

(65) Prior Publication Data
US 2019/0189478 A1 Jun. 20, 2019

(30) Foreign Application Priority Data
Dec. 20, 2017 (EP) .................................. 17209102

(51) Int. Cl.
*H01L 21/67* (2006.01)
*B65G 47/90* (2006.01)

(52) U.S. Cl.
CPC ...... *H01L 21/67144* (2013.01); *B65G 47/904* (2013.01); *H01L 21/67259* (2013.01)

(58) Field of Classification Search
CPC ............ H01L 21/67144; H01L 21/259; B65G 47/904
See application file for complete search history.

(56) References Cited

U.S. PATENT DOCUMENTS

2011/0150607 A1* 6/2011 Hong ................ H01L 21/67253
414/222.01
2016/0336207 A1* 11/2016 Stokkermans .. H01L 21/671444

OTHER PUBLICATIONS

European Search Report and Written Opinion for corresponding European application EP17209102.7 dated Jun. 18, 2018, 7 pages.

* cited by examiner

*Primary Examiner* — Ronald P Jarrett
(74) *Attorney, Agent, or Firm* — Ohlandt, Greeley, Ruggiero & Perle, L.L.P.

(57) ABSTRACT

An apparatus is provided for transferring a semiconductor device from a wafer to a target position. The apparatus has at least one rotatable transfer assembly, which has a transfer head rotatable about an axis of rotation of the rotatable transfer assembly to transfer a semiconductor device from a pick-up position to a transfer position. The apparatus also has a transfer assembly actuator arrangement operative to effect movement of the at least one rotatable transfer assembly in an axial direction relative to a plane of rotation of the transfer head.

12 Claims, 7 Drawing Sheets

APPARATUS AND SYSTEM

CROSS REFERENCE TO RELATED APPLICATIONS

This application claims benefit under 35 U.S.C. § 119(a) of European Patent Application No. EP17209102.7 filed Dec. 20, 2017, the entire contents of which are incorporated herein by reference.

BACKGROUND OF THE DISCLOSURE

1. Field of the Disclosure

The present invention relates to an apparatus and system for transferring a semiconductor device from a wafer to a target position. In particular, but not exclusively, the present invention relates to an apparatus and system for transferring a semiconductor device from a wafer to a target position, where the target position may be located at, for example, a carrier structure, such as a carrier tape or a lead frame.

2. Description of Related Art

Conventionally, semiconductor devices are manufactured on and in a circular plane substrate, also referred to as a wafer, in a matrix having a plurality of rows and columns of such circuits, which usually are all identical and usually all have the same dimensions, although these are no prerequisites. After the wafer production, a surface of the wafer is adhered to a flexible carrier film. The respective circuits are then physically separated from each other by cutting through the wafer from one surface to the opposite surface without cutting through the carrier film. Thus, a plurality of individual semiconductor devices, or circuits, (hereinafter also to be referred to as "chips" or "dies") arranged on the carrier film is obtained.

In a typical chip transfer apparatus, a chip transfer unit and a chip flip unit are used to pick up a semiconductor chip from a semiconductor wafer, to flip the orientation of the semiconductor chip, and to place the semiconductor chip at a target position, e.g. on to a carrier structure. For example, the chip transfer unit can be used to pick up an integrated circuit (IC) die from a wafer and transfer the IC die onto the chip flip unit, which is typically placed between the chip transfer unit and the target position. The chip flip unit can be used to flip the orientation of the IC die and to place the flipped IC die at the target position. For example, a wafer is usually positioned with the active side (also referred to as the bumped side, top side, or front side) facing the chip transfer and chip flip units. The chip transfer unit picks up the IC die on the bumped side while the chip flip unit flips the IC die such that the bumped side is down and places the flipped IC die at the target position with the bumped side facing downward.

Each chip is mechanically picked up and disengaged from the carrier film by a needle mechanism interacting with a transfer head of the chip transfer unit, the transfer head being in a chip pick-up position. Prior to each chip pick-up process, the chip is taken to the chip pick-up position by moving the wafer. After pick-up, the chip is transferred by the transfer head to a lead frame where the chip is released from the transfer head and fixedly mounted (bonded) on the lead frame, the transfer head being in a chip bonding position. Next, contact pads of each chip are electrically connected to contact pins of the lead frame in a wire bonding process. In other processes, where the chip is to be transferred, the chip, after pick-up, is transferred by the transfer head to a carrier tape, or to a chip flip unit (when the chip is to be flipped).

Typically, a chip transfer unit of a chip transfer apparatus comprises a rotary head with a number of transfer heads located thereon. Each transfer head comprises a collet, or vacuum pipette, operative to pick up a chip by vacuum. Thus, a transfer head of the rotary head can pick-up a chip from the wafer while another transfer head of the rotary head is placing a chip at a target position, e.g. on a carrier structure. It will be appreciated that during a transfer process, a chip will be handed over twice, i.e. at pick-up from wafer to transfer head and at placement from transfer head to the target position, e.g. a carrier structure such as a lead-frame or carrier tape.

In a so-called "flip-chip" arrangement, a second chip transfer unit is provided (i.e. a chip flip unit). Thus, a transfer head of the chip transfer unit can pick-up a chip from the wafer. The chip is transferred to a handover position, i.e. where the chip is passed to a transfer head of the chip flip unit, by rotating the rotary head so that the chip-carrying transfer head is moved from the pick-up position to the handover position. At the handover position, the chip is passed to a transfer head of the chip flip unit. The chip flip unit may then operate to move the chip to another location, e.g. so as to be positioned at a target position. It will be appreciated that, in a flip-chip transfer process, an additional handover, i.e. from the first chip transfer unit to the chip flip unit, is required. Thus, there are three handovers, which comprise: pick-up from wafer to transfer head; handover from the transfer head of the chip transfer unit to the transfer head of the chip flip unit; and placement from the transfer head of the chip flip unit to the target position.

To be able to handover very small chips at all these locations, i.e. in both the flip-chip process and non-flip-chip (normal) process, the position of the collets needs to align very accurately with the pick or place position targets. Due to relatively large tolerances in parts of the transfer apparatus (e.g. of the transfer head), alignment requires a dedicated position correction of every collet. In a tangential direction this is possible by rotation of the rotary head. In a radial direction the position of the collets is adjusted by way of an actuator. That is, correction of collet alignment is possible in two directions (i.e. in the plane in which the transfer heads/collets rotate).

Whilst correction of collet alignment in the manner as described above may be satisfactory, and may continue to be satisfactory for certain operating conditions, the inventors have recognised that corrections performed in this manner may result in low position accuracy (limiting small chip size). Further they may need to be performed by a human technician, and may result in down-time when placing (or replacing) transfer heads.

The present invention has been devised with the foregoing in mind.

SUMMARY

According to an aspect of the invention there is provided an apparatus for transferring a semiconductor device from a wafer to a target position, comprising: at least one rotatable transfer assembly comprising a transfer head rotatable about an axis of rotation of said rotatable transfer assembly to transfer a semiconductor device from a pick-up position to a transfer position; and a transfer assembly actuator operative to effect movement of said at least one rotatable transfer assembly in an axial direction relative to a plane of rotation of said transfer head.

The apparatus provides for adjustment of transfer heads of a rotatable transfer assembly not only in a rotational direction and a radial direction, but also in an axial direction. Thus, the apparatus has three degrees of freedom, which may make it possible to align quickly and accurately in every cycle (and possibly without the need for a human operator to make adjustments). This may provide a relatively fast chip transferring apparatus, or flip-chip transferring apparatus, for chips.

Optionally, the transfer assembly actuator may comprise a transfer assembly actuator for the or each of said at least one rotatable transfer assembly, the or each transfer assembly actuator operative to effect movement of a respective rotatable transfer assembly in an axial direction of an axis of rotation of said respective rotatable transfer assembly.

Optionally, the at least one rotatable transfer assembly may comprise a first rotatable transfer assembly, wherein the first rotatable transfer assembly is operative to: rotate said transfer head thereof to said pick-up position; and rotate said transfer head to said transfer position.

Optionally, the transfer position may comprise the target position. Further optionally, the target position may comprise a position where said semiconductor device is located for placement on a carrier structure. Yet further optionally, the target position may comprise a position where the semiconductor device is located for placement on a carrier tape. Still further optionally, the target position may comprise a position where the semiconductor device is located for placement on a leadframe.

Optionally, the at least one rotatable transfer assembly may comprise a first rotatable transfer assembly and a second rotatable transfer assembly, each of the first and second rotatable transfer assemblies comprising a transfer head, wherein the first rotatable transfer assembly is operative to: rotate said transfer head thereof to said pick-up position to pick up said semiconductor device from said wafer; and rotate said transfer head thereof to said transfer position.

Optionally, the transfer position may comprise a position where said semiconductor device is located for transfer from said first rotatable transfer assembly to said second rotatable transfer assembly.

Optionally, the second rotatable transfer assembly may be operative to: rotate said transfer head thereof to said transfer position; receive said semiconductor device from said transfer head of said first rotatable transfer assembly; and rotate said transfer head of said second rotatable transfer assembly to the target position. Further optionally, the target position may comprise a position where the semiconductor device is located for placement on a carrier structure. Yet further optionally, the target position may comprise a position where the semiconductor device is located for placement on a carrier tape. Still further optionally, the target position may comprise a position where the semiconductor device is located for placement on a leadframe.

Optionally, the transfer assembly actuator may comprise a motor. Further optionally, the motor may comprise a homopolar motor.

Optionally, the at least one rotatable transfer assembly may be moveable in said axial direction simultaneously with transfer of said semiconductor device at said transfer position.

According to another aspect of the present invention, there is provided a system for transferring a semiconductor device from a wafer to a target position, comprising: an apparatus as described above and/or hereinafter; and an alignment monitoring device operative to determine a location of the or each transfer head with respect to the pick-up and transfer positions and compare a determined location of the pick-up device to a target location for the or each transfer head.

Optionally, responsive to identification of a difference between said determined location of said pick-up device to said target location of said pick-up device for said at least one of said pick-up and transfer positions, said alignment monitoring device may be operative to communicate a signal to at least one of: a controller for controlling operation of an actuator operative to effect rotation of said at least one rotatable transfer assembly; and a controller for controlling operation of said transfer assembly actuator, to adjust said location of said pick-up device in said axial direction and/or in said plane of rotation of the or each transfer head.

Optionally, the system may further comprise a wafer holding device configured to hold a wafer for pick-up of a semiconductor device therefrom by rotatable transfer assembly of said apparatus.

BRIEF DESCRIPTION OF THE DRAWINGS

One or more specific embodiments in accordance with aspects of the present invention will be described, by way of example only, and with reference to the following drawings in which.

DETAILED DESCRIPTION

Figure 1:
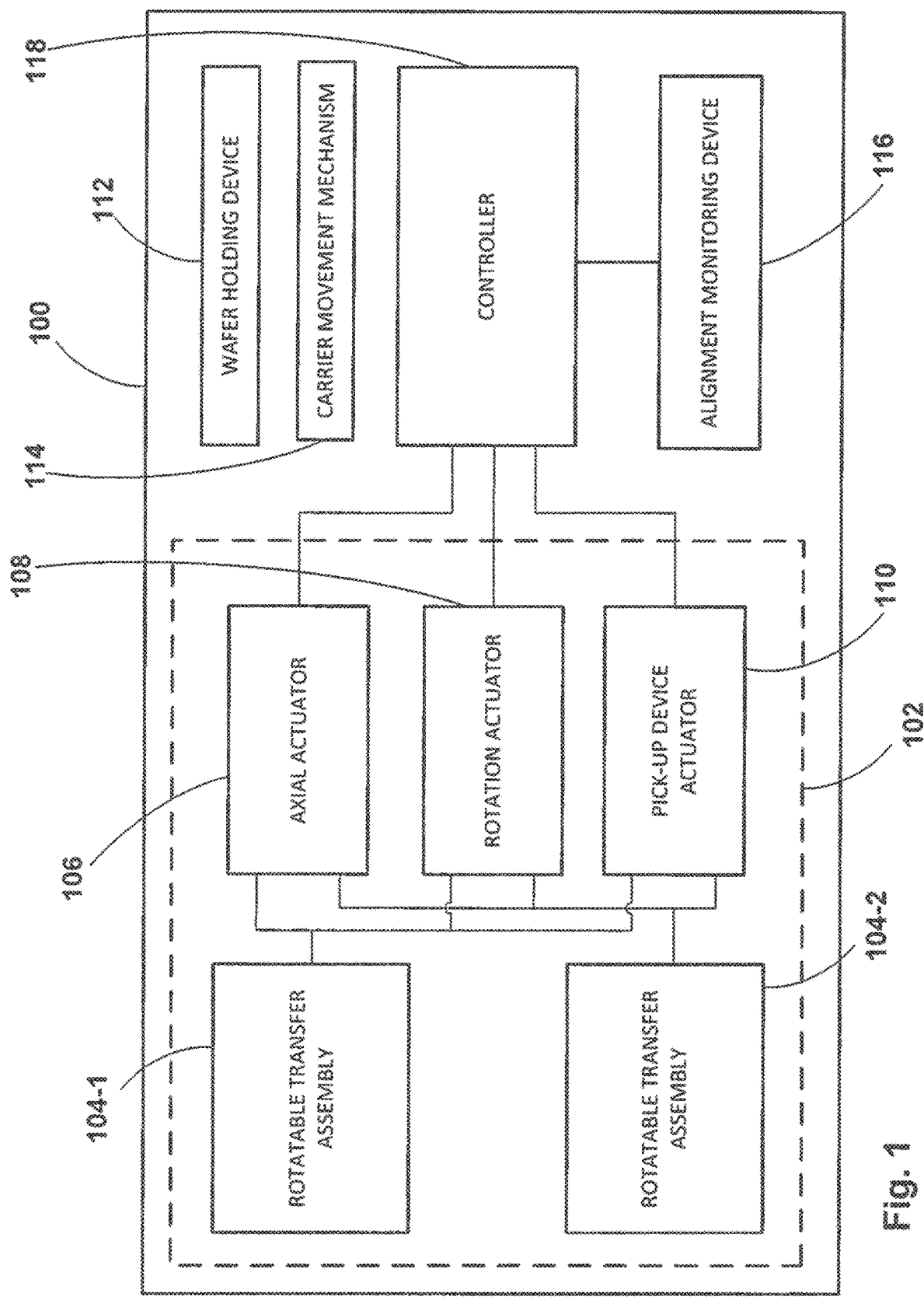
FIG. 1 illustrates a schematic block diagram of a system for transferring a semiconductor device from a wafer to a target position in accordance with one or more embodiments of the present invention.

FIG. 1 illustrates a schematic block diagram of a system 100 for transferring a semiconductor device from a wafer to a target position in accordance with one or more embodiments of the present invention. The target position may be at, or on, a carrier structure, such as a leadframe or a carrier tape. The system 100 includes an apparatus 102, a wafer holding device 112, a carrier movement mechanism 114, an alignment monitoring device 116, and a controller 118.

Apparatus 102 comprises two rotatable transfer assemblies 104-1, 104-2, an axial actuator 106, a rotation actuator 108 and a pick-up device actuator 110. The actuators 106, 108, 110 comprise driver devices for effecting movement of various parts of the two rotatable transfer assemblies responsive to receipt of control signals from the controller 118.

The system 100 can be used for semiconductor device packaging. For example, the system 100 can be used to transfer semiconductor devices from a wafer to a target position, e.g. a carrier structure, such as a lead frame or a carrier tape. Examples of semiconductor devices that can be transferred by the system 100 include, without being limited to, integrated circuit (IC) chips, IC dies and other IC modules. The size of an IC die can be in any suitable range. The rotatable transfer assemblies 104-1, 104-2 of apparatus 102 are used to transfer a semiconductor device from a wafer held by the wafer holding device 112 onto a surface of the carrier structure that is located at the carrier movement mechanism 114. Each of the rotatable transfer assemblies may have at least two transfer heads and each of the transfer heads is used to transfer one semiconductor device at one time. The rotatable transfer assemblies 104-1, 104-2 can pick up and hold, using pick-up devices thereon (e.g. collets), semiconductor devices by suction, by force or by other applicable means.

The axial actuator 106, rotation actuator 108 and the pick-up device actuator 110 are operative to control the position of transfer heads of the rotatable transfer assemblies 104-1, 104-2. These actuators will be described in more detail in relation to FIG. 7.

The wafer holding device 112 of the system 100 is configured to hold a wafer, which includes a number of semiconductor devices (e.g., IC dies or chips fabricated thereon and semiconductor packages), in place for semiconductor device pick-up by at least one of the rotatable transfer assemblies 104-1, 104-2.

The carrier movement mechanism 114 of the system 100 is used to position or move a carrier structure (e.g., a lead frame or a carrier tape). The carrier movement mechanism 114 may have a channel through which a carrier structure is fed. The carrier structure may comprise a bond surface on which the semiconductor devices are placed. Examples of the carrier structure include, without being limited, lead frames and carrier tapes. The carrier movement mechanism 114 may be a moving platform (e.g., a conveyor system) such that the carrier structure can continuously change the position at which a semiconductor device is placed. Examples of the carrier movement mechanism are reel-to-reel lead-frame indexers, strip-to-strip indexers and reel-to-reel carrier tape indexers.

The alignment monitoring device 116 of the system 100 is configured to check an alignment of pick-up devices of the transfer heads of transfer assemblies 104-1, 104-2 during the transfer process from a wafer at the wafer holding device 112 to the carrier structure that is located at the carrier movement mechanism 114. The alignment monitoring device 116 may optically check alignments of the pick-up devices. In one or more embodiments, the alignment monitoring device 116 may include a machine vision system (e.g., an optics system such as a CMOS camera) controlled by the controller. The alignment monitoring device 116 can check an alignment of the pick-up devices: before picking up the semiconductor device from a wafer at the wafer holding device 112; while the semiconductor device is being transferred; before the semiconductor device is placed onto the carrier structure; and/or after the semiconductor device is placed onto the carrier structure.

The controller 118 of the system 100 is used to control rotation actuator 108 to effect rotation of the rotatable transfer assemblies 104-1, 104-2, e.g., to cause the rotation actuator 108 to drive the rotatable transfer assemblies 104-1, 104-2 to transfer a semiconductor device from the wafer at the wafer holding device 112 onto a bond surface of the carrier structure that is located at the carrier movement mechanism 114. Additionally, the controller 118, responsive to receipt of positional data determined by the alignment monitoring device 116, is operative to effect adjustment rotary movements of the rotatable transfer assemblies 104-1, 104-2. Also, the controller 118, responsive to receipt of positional data determined by the alignment monitoring device 116, is used to control axial actuator 106 to effect movement of the rotatable transfer assemblies 104-1, 104-2 in an axial direction. That is, to cause the axial actuator 106 to effect movement of the rotatable transfer assemblies in an axial direction relative to a plane of rotation of one or more transfer heads of the transfer assemblies. Further, the controller 118 is operative, responsive to receipt of positional data determined by the alignment monitoring device 116, to control pick-up device actuator 110 to effect movement of one or more pick-up devices in a radial direction.

Therefore, the controller 118 can adjust locations of one or more pick-up devices of the rotatable transfer assemblies 104-1, 104-2 in a tangential direction, a radial direction and/or an axial direction.

Figure 2:
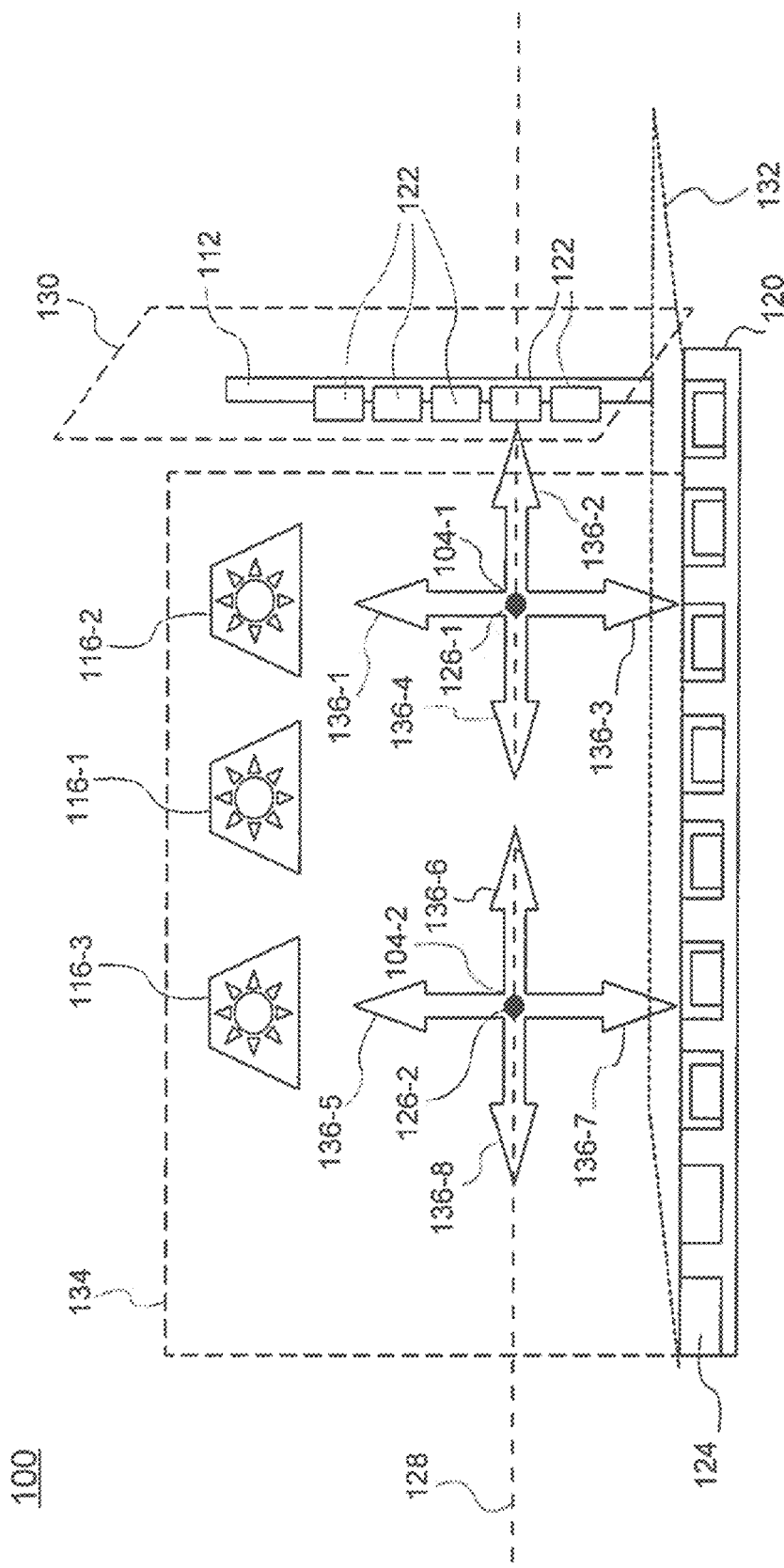
FIG. 2 schematically illustrates the system for transferring a semiconductor device from a wafer to a target position in accordance with one or more embodiments of the present invention.

FIG. 2 illustrates the system 100 in which centres of the rotatable transfer assemblies 104-1, 104-2 are positioned in parallel with a plane in which a bond surface of a carrier structure 120 that is positioned by the carrier movement mechanism 114 extends. In the semiconductor device transfer system 100 illustrated schematically in FIG. 2, two rotatable transfer assemblies 104-1, 104-2 are used to transfer semiconductor devices 122 (e.g. IC chips or dies) from a wafer held by a wafer holding device 112 onto a bond surface 124 of the carrier structure 120 that is positioned by the carrier movement mechanism. Alignment monitoring devices 116-1, 116-2, 116-3 are used to check the transfer of semiconductor devices in different positions. Rotating centres 126-1, 126-2 of the rotatable transfer assemblies 104-1, 104-2 are located at a dotted line 128 depicted in FIG. 2 (to depict horizontal alignment of the rotating centres 126-1, 126-2 in the illustrated embodiment, i.e. that the centres are in the same plane). In other embodiments, the axes of rotation of the rotatable transfer assemblies need not be horizontally aligned.

The wafer held by the wafer holding device 112 is located in a first plane 130 and is movable in that plane. The surface in which the target position lies (e.g. a surface of a carrier structure) extends in a second plane 132, which optionally may be parallel with the dotted line 128 and optionally may be perpendicular to the first plane 130. Reference numeral 134 denotes a third plane (i.e. a device transfer plane) in which a semiconductor device is picked up from the wafer and transferred to the carrier structure by the rotatable transfer assemblies 104-1, 104-2. Optionally the third plane 134 may be perpendicular to the first plane 130 and the second plane 132. The rotatable transfer assemblies 104-1, 104-2 and the alignment monitoring devices 116-1, 116-2, 116-3 illustrated in FIG. 2 are examples of the rotatable transfer assemblies 104-1, 104-2 and the alignment monitoring device 116 illustrated schematically in block diagram form in FIG. 1.

Each rotatable transfer assembly 104-1, 104-2 has multiple transfer heads, which can be any suitable number of transfer heads (e.g. four transfer heads or eight transfer heads). In the illustrated example of FIG. 2, the rotatable transfer assembly 104-1 has four transfer heads 136-1, 136-2, 136-3, 136-4 and the rotatable transfer assembly 104-2 also has four transfer heads 136-5, 136-6, 136-7, 136-8.

In general, a four head set-up moves in 4×90 degree incremental moves to complete a semiconductor die transfer cycle. After each move of 90 degrees, a process takes place, e.g. die pick-up at 3 o'clock, die inspection at 12 o'clock, die hand over at 9 o'clock, etc. Each transfer head is used to transfer one semiconductor device at a time. For example, within a transfer cycle, the transfer head 136-1 of the rotatable transfer assembly 104-1 can be used to pick up a first semiconductor device, the transfer head 136-2 can be used to transfer a second semiconductor device, the transfer head 136-3 can be used to transfer a third semiconductor device, and the transfer head 136-4 can be used to transfer a fourth semiconductor device. By positioning the second rotatable transfer assembly 104-2 next to the rotatable transfer assembly 104-1 and in parallel with the bond surface 124 of the carrier structure 120, the rotation of semiconductor devices in the transfer process is in parallel with the carrier structure. Consequently, the flip function of semiconductor devices can be enabled at a similar speed and using similar processes as a non-flip semiconductor transfer system.

Alignment monitoring devices 116-1, 116-2, 116-3 are located in different locations within the system 100 and are used to check the transfer of semiconductor devices in different positions. Specifically, the alignment monitoring device 116-1 is located between the rotatable transfer assembly 104-1 and the rotatable transfer assembly 104-2 and is used to check an alignment of transfer heads of the rotatable transfer assemblies 104-1, 104-2 at a transfer (handover) position. This check may determine if the transfer heads of one transfer assembly are aligned with those of another and/or may determine if the transfer heads of both transfer assemblies are aligned with a target location for the transfer position.

The alignment monitoring device 116-2 is located to monitor the rotatable transfer assembly 104-1 and can be used to check an alignment of transfer heads at a pick-up position and/or a transfer position. This check can determine if the transfer heads of rotatable transfer assembly 104-1 are aligned with a target location for the pick-up position. Optionally, the check may also determine if the transfer heads of rotatable transfer assembly 104-1 are aligned with those of the other rotatable transfer assembly 104-2 and/or with a target location for the transfer position.

The alignment monitoring device 116-3 is located to monitor the rotatable transfer assembly 104-2 and can be used to check an alignment of transfer heads at a transfer (handover) position and/or a die placement position, i.e. where the die is located for placement on the carrier structure 120. This check can determine if the transfer heads of rotatable transfer assembly 104-2 are aligned with a target location for the die placement position. Optionally, the check may also determine if the transfer heads of rotatable transfer assembly 104-2 are aligned with those of the other rotatable transfer assembly 104-1 and/or with a target location for the transfer position.

The alignment monitoring devices 116-1, 116-2, 116-3 can optically check the alignment of transfer heads, for example, by irradiating the pick-up position, handover position and die placement position with a light and checking the reflection of the light by the transfer heads at such positions.

Figure 3:
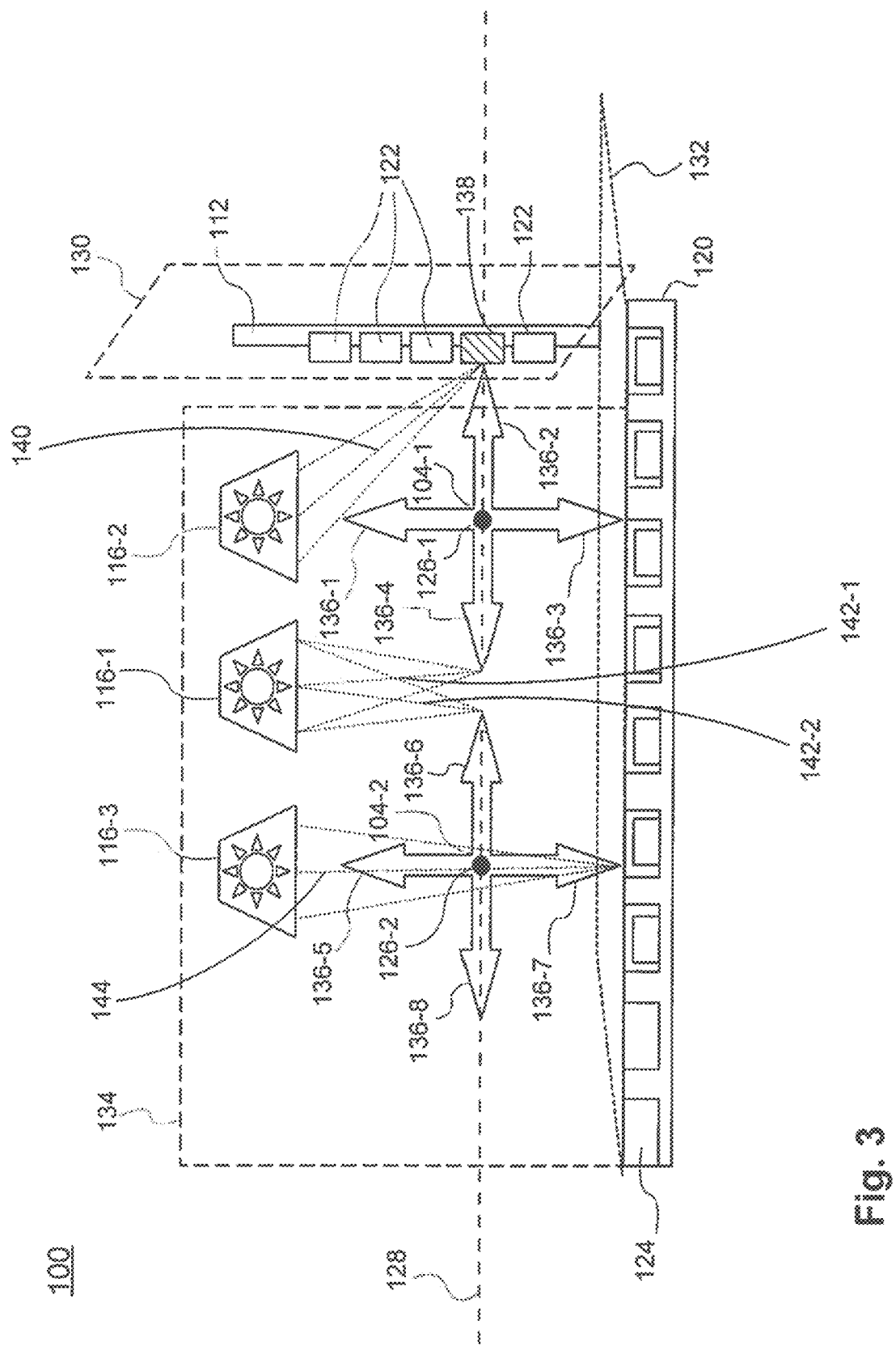
FIG. 3 schematically illustrates an alignment checking operation implemented by the system of one or more embodiments of the present invention.

FIG. 3 illustrates the system 100 of FIG. 2 when an alignment check step is performed.

This check step can be used to determine if: the transfer heads of rotatable transfer assembly 104-1 are aligned with a target location for the pick-up position; the transfer heads of one transfer assembly are aligned with those of another and/or the transfer heads of both transfer assemblies are aligned with a target location for the transfer position; and the transfer heads of rotatable transfer assembly 104-2 are aligned with a target location for the die placement position.

As shown in FIG. 3, alignment monitoring device 116-2 checks the alignment of the transfer heads 136-1, 136-2, 136-3, 136-4 of rotatable transfer assembly 104-1 relative to the wafer holding device 112 at a pick-up position 138. The alignment monitoring device 116-2 optically checks the alignment of the transfer heads 136-1, 136-2, 136-3, 136-4 of rotatable transfer assembly 104-1 relative to the wafer holding device 112. For example, the alignment monitoring device 116-2 checks the alignment of the transfer heads 136-1, 136-2, 136-3, 136-4 of rotatable transfer assembly 104-1 by shining light 140 toward a region of a pick-up position and checking the reflection of the light from that region so as to determine whether the transfer head 136-2 is aligned with the pick-up position. If the alignment check step determines that the transfer head 136-2 (and thus rotatable transfer assembly 104-1) is not properly aligned with the pick-up position, the controller 118 can, responsive to a signal containing positional data received from the alignment monitoring device 116-2, communicate alignment signals to at least one of the axial actuator 106, rotation actuator 108 and pick-up device actuator 110 to cause a movement of the rotatable transfer assembly (and/or parts thereof) in at least one of an axial direction (i.e. in a direction into, or out of the page of the figure), a tangential direction (i.e. by rotating the transfer assembly 104-1), and a radial direction (i.e. by moving the tips of the pick-up devices of the transfer heads).

An alignment check at the transfer position (i.e. a position where the die is handed over from the rotatable transfer assembly 104-1 to the rotatable transfer assembly 104-2) is performed by the alignment monitoring device 116-1. For example, the alignment monitoring device 116-1 optically checks the alignment of rotatable transfer assemblies 104-1, 104-2 (to ensure that their transfer heads are located to rotate in the same plane). This is achieved by shining light 142-1 at a region of a transfer position and checking the reflection of the light from that region so as to determine whether the transfer heads 136-4, 136-6 are aligned with the transfer position and with one another. If the alignment check step determines that one, or both, of the transfer heads 136-4, 136-6 (and thus rotatable transfer assemblies 104-1, 104-2) are not properly aligned with the transfer position, the controller 118 can, responsive to a signal containing positional data received from the alignment monitoring device 116-1, communicate alignment signals to at least one of the axial actuator 106, rotation actuator 108 and pick-up device actuator 110 to cause a movement of the rotatable transfer assemblies 104-1 and/or 104-2 (and/or parts thereof) in at least one of an axial direction (i.e. in a direction into, or out of the page of the figure), a tangential direction (i.e. by rotating the transfer assemblies 104-1 and/or 104-2), and a radial direction (i.e. by moving the tips of the pick-up devices of the transfer heads).

An alignment check at the target position, e.g. a placement position (i.e. a position where the die is placed on to the carrier structure 120) is performed by the alignment monitoring device 116-3. For example, the alignment monitoring device 116-3 optically checks the alignment of rotatable transfer assembly 104-2. This is achieved by shining light 144 at a region of a placement position so as to determine whether the transfer head 136-7 is aligned with the placement position. If the alignment check step determines that the transfer head 136-7 (and thus rotatable transfer assembly 104-2) are not properly aligned with the placement position, the controller 118 can, responsive to a signal containing positional data received from the alignment monitoring device 116-3, communicate alignment signals to at least one of the axial actuator 106, rotation actuator 108 and pick-up device actuator 110 to cause a movement of the rotatable transfer assembly 104-2 (and/or parts thereof) in at least one of an axial direction (i.e. in a direction into, or out of the page of the figure), a tangential direction (i.e. by rotating the transfer assembly 104-2), and a radial direction (i.e. by moving the tips of the pick-up devices of the transfer heads).

Figure 4:
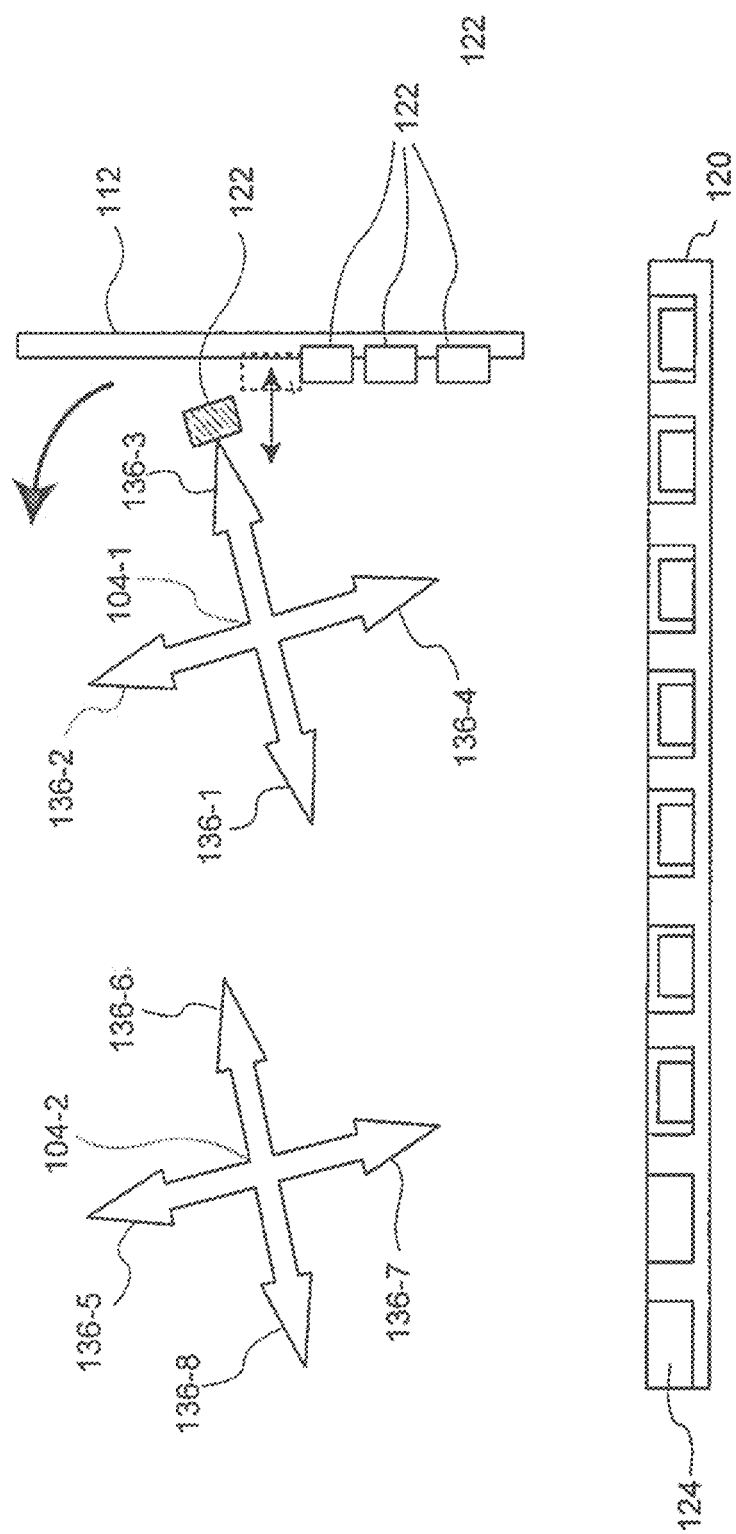
FIGS. 4 to 6 illustrate an example of a cycle of the system illustrated in FIG. 2.

After the alignment check step shown in FIG. 3 determines that the rotatable transfer assemblies 104-1, 104-2 are properly aligned, a semiconductor device is picked up from the wafer. FIG. 4 depicts the system 100 shortly after the semiconductor device is picked up from the wafer by the transfer head 136-3 of the rotatable transfer assembly 104-1. As shown in FIG. 4, the transfer head 136-3 of the rotatable transfer assembly 104-1 is rotated to carry the semiconductor device from the pick-up position. Further rotation of the rotatable transfer assembly 104-1 rotates the transfer head 136-4 to the chip pick-up position to pick up another semiconductor device. In this transfer move, the transfer head 136-2 is indexed to a die transfer position at 9 o'clock.

Figure 5:
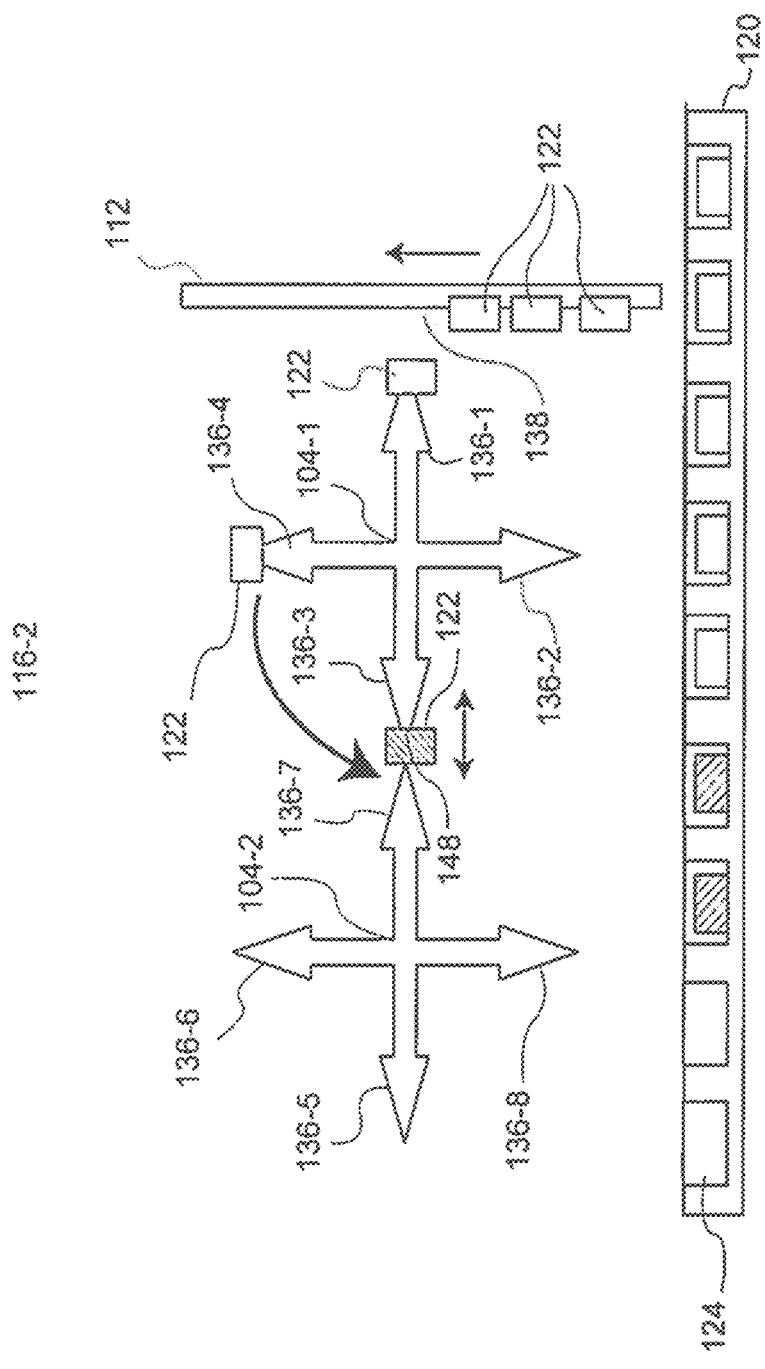

After the semiconductor device 122 is picked up from the wafer holding device 112, the rotatable transfer assembly 104-1 is rotated to transfer the semiconductor device to the rotatable transfer assembly 104-2. FIG. 5 depicts a semiconductor device transfer step in which the semiconductor device is transferred from the rotatable transfer assembly 104-1 to the rotatable transfer assembly 104-2. As shown in FIG. 5, the transfer head 136-3 of the rotatable transfer assembly 104-1 is rotated to a transfer (i.e. a handover or chip flip) position 148, from which the semiconductor device is picked up by the transfer head 136-7 of the rotatable transfer assembly 104-2. In one or more embodiments, the transfer head 136-3 of the rotatable transfer assembly 104-1 is rotated 180 degrees from the pick-up position 138 to the transfer position 148.

Figure 6:
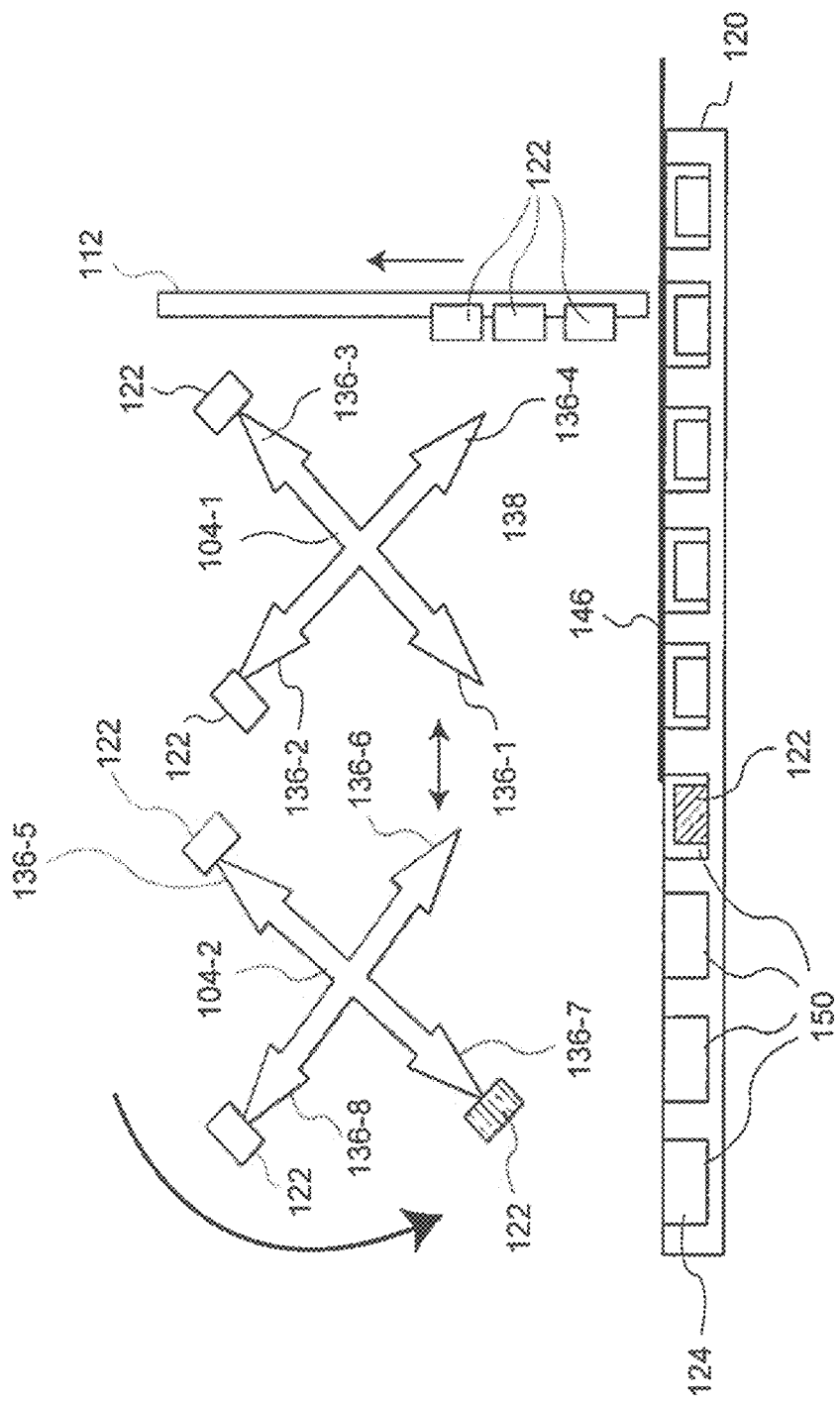

After the semiconductor device 122 is transferred to the rotatable transfer assembly 104-2, the rotatable transfer assembly 104-2 is rotated to place the semiconductor device onto the carrier structure 120. The semiconductor device (e.g., a semiconductor die) can be placed on a horizontal bond pad in a die bonding process. Alternatively, the semiconductor device (e.g., a semiconductor chip or a quad-flat no-leads (QFN) package) can be placed into a cavity of the blister tape or carrier tape in a die sorting or taping process. FIG. 6 depicts the system 100 before the semiconductor device 122 is transferred from the rotatable transfer assembly 104-2 onto the bond surface 124 of the carrier structure. As shown in FIG. 6, the transfer head 136-7 of the rotatable transfer assembly 104-2 is rotated to place the semiconductor device into an opening 150 (e.g., a gap or a hole) on the bond surface of the carrier structure. In some embodiments, the cover layer 146 (e.g. a tape layer) covers (e.g. rolls onto) the opening to seal the semiconductor device into the carrier structure 120.

Figure 7:
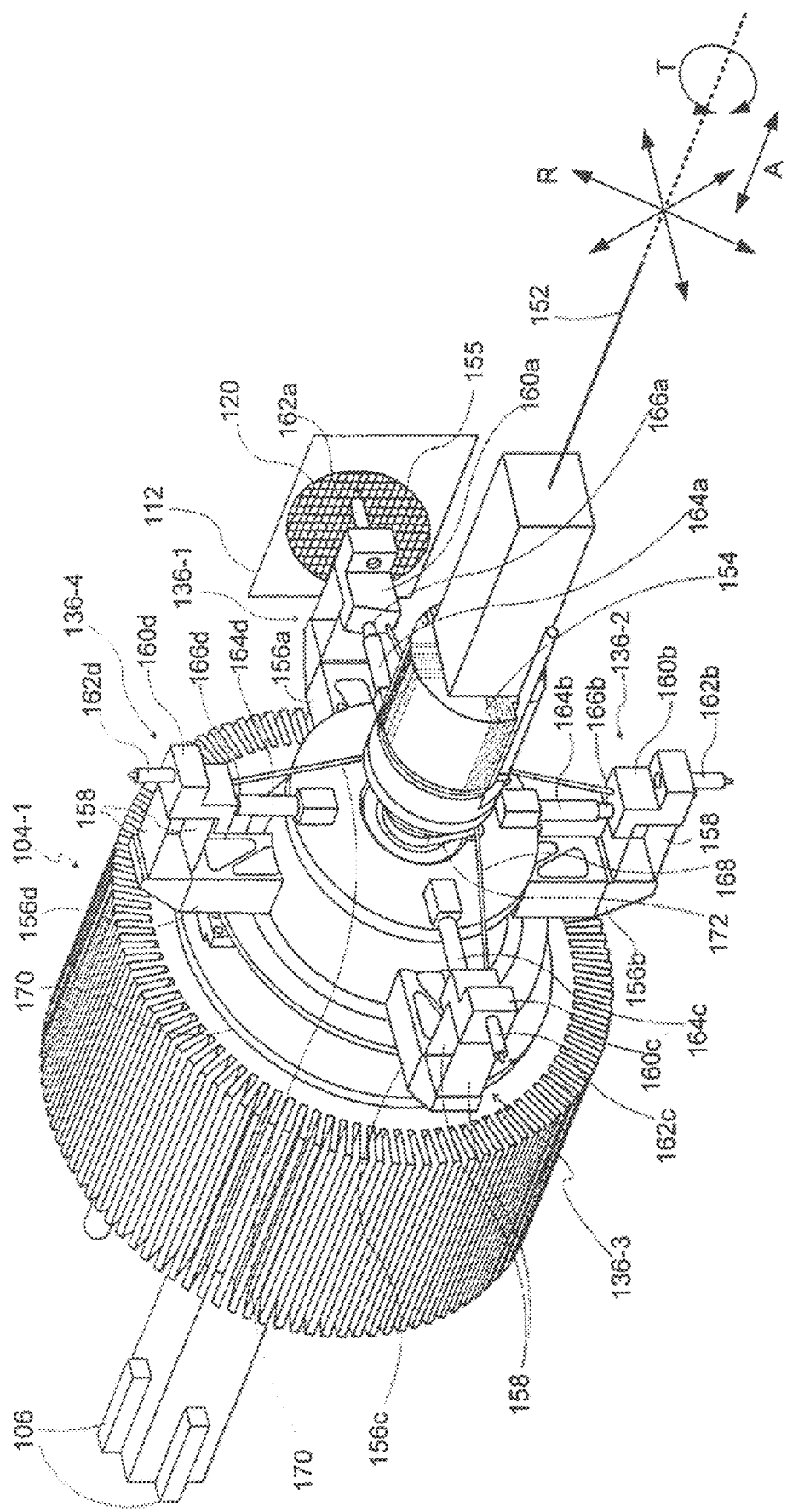
FIG. 7 illustrates an apparatus in accordance with one or more embodiments of the present invention of the system for transferring a semiconductor device from a wafer to a carrier structure.

FIG. 7 illustrates an embodiment of the rotatable transfer assembly 104-1 of FIG. 2. A rotatable transfer assembly 104-1 includes four transfer heads 136-1, 136-2, 136-3, 136-4. The rotatable transfer assembly is configured to rotate about an axis 152 and is driven by a motor 170 clock-wise or anti-clockwise (counter-clockwise). This movement is effected responsive to a signal received from the rotation actuator 108 (see FIG. 1), which can control operational movement of the transfer assembly, and correction movements of the transfer assembly (i.e. small movements of the transfer heads for positional corrections—denoted by arrow T in the figure). A surface of a chip 120 on a wafer 155 is positioned opposite a transfer head 136 in a chip pickup position. In an operation of the rotating assembly, a chip 120 is picked up from the wafer 155 by the transfer head 136-1 and is rotated to a transfer, handover, or chip-flip position (i.e. to the location occupied by the transfer head 136-3 in the figure) after two index steps. The rotatable transfer assembly 104-2 depicted in FIG. 2 can be implemented the same as or similar to the rotatable transfer assembly 104-1 depicted in FIG. 7.

In the rotatable transfer assembly 104-1, each transfer head 136-1, 136-2, 136-3, or 136-4 includes an arm 156a-156d, respectively, a pair of parallel leaf springs 158, blocks 160a-160d, respectively, a collet 162a-162d, respectively, an arm 164a-164d, respectively, and pressure springs 166a-166d, respectively. Each collet 162a-162d is movable to and fro over a short distance essentially in the radial direction at right angles to the axis 152 (denoted by arrows R in the figure). Radial movement is effected by motor 154, which is controlled responsive to a signal received from the pick-up device actuator 110 (see FIG. 1). Optionally, a second motor may be employed to effect radial movement.

The transfer heads are connected to motor 170 that is used to drive the assembly about axis 152. Each arm 156a-156d extends essentially radially to the axis 152 from the rotatable transfer assembly. At, or proximal to, the ends of each of the arms 156a-156d, the ends of the pair of parallel leaf springs 158 are fixedly mounted and opposite ends of the pair of leaf springs 158 support the blocks 160a-160d, respectively. In each block 160a-160d, the collet 162a-162d, respectively, is fixedly mounted. The collet 162a-162d is used to pick up and hold a semiconductor device 120 (e.g., an IC chip or die) by suction, by force or by other applicable methods. Optionally, the collet may have at least one pick-up opening for picking up, holding, and releasing a semiconductor device by varying the pressure at the pick-up opening. When the collet is in a semiconductor device pick-up position, the pick-up opening is brought into close proximity to the semiconductor device, and a low pressure (e.g. a vacuum) is generated in the opening, whereby the semiconductor device is sucked to and against the opening. While maintaining the low pressure, the semiconductor device is transferred by the collet to another chip transfer position, and the semiconductor device can be released by applying a higher pressure to the pick-up opening.

Each transfer head also includes the arm 164a-164d, respectively, extending essentially radially to the axis 152 from the rotatable transfer assembly. The pressure springs 166a-166d are mounted between the ends of the arms 164a-164d and the respective blocks 160a-160d.

The block 160a of the transfer head 136-1 is connected to the block 160c of the transfer head 136-3 by a wire 168 and the block 160b of the transfer head 136-2 is connected to the block 160d of the transfer head 136-4 by a wire 170. The wire 168 is fixedly connected, e.g. clamped, to a lever, which is connected to a rotatable shaft driven by the motor.

Controller (not shown), responsive to receipt of a signal from the alignment monitoring device 116, operates to initiate an alignment process to achieve alignment of the transfer heads of the rotatable transfer assembly 104-1 with a target location at the pick-up position and/or at the transfer position. If the transfer position is a handover position to a second rotatable transfer assembly, the controller also operates to initiate an alignment process to achieve alignment of the transfer heads of the rotatable transfer assembly 104-1 with those of the second rotatable transfer assembly 104-2, and those of the second rotatable transfer assembly 104-2 with a placement position. The controller achieves this by sending a control signal to one or more of the axial actuator 106, rotation actuator 108 and/or the pick-up device actuator 110. The axial actuator 106 controls a motor to effect movement of the transfer assembly (or assemblies) along axis 152 (i.e. in an axial direction denoted by arrow A). The rotation actuator 108 controls motor 170 to effect movement of the transfer heads of the transfer assembly (or assemblies) in a rotational direction (i.e. denoted by arrow T in the figure). The pick-up device actuator 110 controls motor 154 to effect movement of the transfer heads of the transfer assembly (or assemblies) in a radial direction (i.e. denoted by arrow R in the figure). Thus, the system can adjust transfer head positions in three-degrees of freedom.

Although the system 100 is shown in FIG. 1 as including certain components, in some embodiments, the system 100 may include fewer or greater components to implement fewer or greater functionalities. For example, the semiconductor system 100 may include more than two rotatable transfer assemblies.

In one or more embodiments, at least one transfer head of the rotatable transfer assembly may include a pick-up device having at least one pick-up opening for picking up, holding, and releasing a semiconductor device by varying the pressure at the pick-up opening. When the transfer head is in a semiconductor device pick-up position, the pick-up opening is brought into close proximity to the semiconductor device, and a low pressure (e.g., vacuum) is generated in the opening, whereby the semiconductor device is sucked to and against the opening. While maintaining the low pressure, the semiconductor device is transferred by the transfer head to another position, and the semiconductor device can be released by applying a higher pressure to the pick-up opening.

In one or more embodiments, the wafer holding device 112 may be located on a moving platform (e.g., a spinning wheel or a convoy belt) or may include a moving platform such that the wafer holding device can continuously change the position from which a semiconductor device is picked up by the rotatable transfer assemblies.

Although the system 100 illustrated in FIG. 1 is shown including one alignment monitoring device 116, optionally the system 100 may include more than one alignment monitoring device 116 that is located in different locations within the system 100 and may be used to check the alignment of the pick-up devices in different positions.

Each rotatable transfer assembly 104-1, 104-2 may be driven by a separate rotation actuator, which is controlled by a corresponding controller, such as, for example a position servo system or an electric-mechanical servo system. Optionally, each transfer assembly may include a servo motor feedback control system that allows for precise control of angular position, radial position and axial position and is controlled by the transfer assembly system controller.

A position of each rotatable transfer assembly 104-1, 104-2 may be adjusted under the control of a same, or separate, axial actuator(s).

A position of each pick-up device of each rotatable transfer assembly 104-1, 104-2 may be adjusted by a same, or separate, rotation actuator(s) and/or a same, or separate, pick-up device actuator(s).

The system 100 illustrated in FIG. 2 is an example of the semiconductor device transfer system illustrated in FIG. 1. However, the semiconductor device transfer system illustrated in FIG. 1 is not limited to the example illustrated in FIG. 2.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

What is claimed is:

1. An apparatus for transferring a semiconductor device from a wafer to a target position, comprising:
    a plurality of rotatable transfer assemblies comprising a first rotatable transfer assembly and a second rotatable transfer assembly, each rotatable transfer assembly comprising a transfer head rotatable about an axis of rotation of the rotatable transfer assembly, wherein the first rotatable transfer assembly is configured to rotate the transfer head thereof about the axis to a pick-up position to pick up the semiconductor device from the wafer and rotate the transfer head about the axis thereof to a transfer position, and wherein the transfer position comprises a position where the semiconductor device is located for transfer from the first rotatable transfer assembly to the second rotatable transfer assembly; and
    a transfer assembly actuator configured to effect movement of at least one of the plurality rotatable transfer assemblies in an axial direction relative to a plane of rotation of the transfer head, wherein the at least one rotatable transfer assembly is moveable in the axial direction simultaneously with transfer of the semiconductor device at the transfer position.

2. The apparatus according to claim 1, wherein the transfer position further comprises the target position.

3. The apparatus according to claim 1, wherein the target position further comprises a position where the semiconductor device is located for placement on a carrier structure.

4. The apparatus according to claim 1, wherein the target position further comprises a position where the semiconductor device is located for placement on a carrier tape.

5. The apparatus according to claim 1, wherein the target position further comprises a position where the semiconductor device is located for placement on a lead frame.

6. The apparatus according to claim 1, wherein the second rotatable transfer assembly is configured to rotate the transfer head thereof to the transfer position, receive the semiconductor device from the transfer head of the first rotatable transfer assembly and rotate the transfer head of the second rotatable transfer assembly to the target position.

7. The apparatus according to claim 6, wherein the target position further comprises a position where the semiconductor device is located for placement on a carrier structure.

8. The apparatus according to claim 6, wherein the target position further comprises a position where the semiconductor device is located for placement on a carrier tape.

9. The apparatus according to claim 6, wherein the target position further comprises a position where the semiconductor device is located for placement on a lead frame.

10. A system for transferring a semiconductor device from a wafer to a target position, comprising:
an apparatus according to claim 1; and
an alignment monitoring device configured to determine a location of the transfer head with respect to the pick-up position and transfer position and compare the determined location to a target location for the transfer head.

11. The system according to claim 10, wherein the transfer head includes a pick-up device, and
wherein the system is responsive to identification of a difference between the determined location of the pick-up device to the target location of the pick-up device for the pick-up position and the transfer position, and
wherein the alignment monitoring device is configured to communicate a signal to at least one of a controller for controlling operation of an actuator configured to effect rotation of the at least one of the plurality of rotatable transfer assemblies, and a controller for controlling operation of the transfer assembly actuator, to adjust the location of the pick-up device in the axial direction and/or in the plane of rotation of the transfer head.

12. The system according to claim 11, further comprising a wafer holding device configured to hold the wafer for pick-up of the semiconductor device therefrom by the first rotatable transfer assembly of the apparatus.

* * * * *